US009935652B1

(12) United States Patent
Chalmer et al.

(10) Patent No.: US 9,935,652 B1
(45) Date of Patent: Apr. 3, 2018

(54) DATA COMPRESSION BY HAMMING DISTANCE CATEGORIZATION

(71) Applicant: EMC IP HOLDING COMPANY LLC, Hopkinton, MA (US)

(72) Inventors: Steven R Chalmer, Redwood City, CA (US); Jonathan Krasner, Coventry, RI (US)

(73) Assignee: EMC IP HOLDING COMPANY LLC, Hopkinton, MA (US)

( * ) Notice: Subject to any disclaimer, the term of this patent is extended or adjusted under 35 U.S.C. 154(b) by 0 days.

(21) Appl. No.: 15/722,073

(22) Filed: Oct. 2, 2017

(51) Int. Cl.
*H03M 7/34* (2006.01)
*H03M 7/30* (2006.01)
*G06F 17/18* (2006.01)
*G06F 17/30* (2006.01)

(52) U.S. Cl.
CPC .......... *H03M 7/3084* (2013.01); *G06F 17/18* (2013.01); *G06F 17/301* (2013.01)

(58) Field of Classification Search
CPC ..... H03M 7/3084; G06F 17/18; G06F 17/301
USPC .................................................... 341/51, 107
See application file for complete search history.

(56) References Cited

U.S. PATENT DOCUMENTS

| 5,491,479 | A | * | 2/1996 | Wilkinson | ........... H04N 5/9264 341/58 |
| 6,084,535 | A | * | 7/2000 | Karabed | .......... G11B 20/10009 341/106 |
| 7,020,821 | B2 | * | 3/2006 | Chang | ....................... H04L 1/08 714/746 |
| 9,369,486 | B2 | * | 6/2016 | Lewis | ................. H04L 63/1475 |

* cited by examiner

*Primary Examiner* — Brian Young
(74) *Attorney, Agent, or Firm* — Anderson Gorecki LLP

(57) ABSTRACT

Data is compressed based on non-identical similarity between a first data set and a second data set. A representation of the differences is used to represent one of the data sets. For example, a probabilistically unique value may be generated as a new block label. Probabilistic comparison of the new block label with a plurality of training labels associated with training blocks produces a plurality of training labels that are potentially similar to the new block label. The Hamming distance between each potentially similar training label and the new block label is determined to select the training label with the smallest calculated Hamming distance from the new block label. A bitmap of differences between the new block and the training block associated with the selected training label is compressed and stored as a compressed representation of the new block.

20 Claims, 3 Drawing Sheets

DATA COMPRESSION BY HAMMING DISTANCE CATEGORIZATION

TECHNICAL FIELD

The subject matter of this disclosure is generally related to data storage, and more particularly to data compression in a data storage system.

BACKGROUND

Server computers are used to run instances of host applications such as databases, file servers and block servers, for example and without limitation. Host application data may be maintained for the server computers by a data storage system such as a storage array. The storage array may include a plurality of interconnected computing nodes that manage access to a plurality of drives such as HDDs (Hard Disk Drives) and SSDs (Solid State Drives) on which the host application data is stored. The host applications access host application data by sending IOs to the storage array. A single storage array may maintain host application data for multiple different host applications running on one or more clusters of servers.

Some host application data may be compressed by the computing nodes before being stored on the managed drives. Compression is a way of encoding information to reduce storage requirements, e.g. so as to require fewer bytes of storage space. Typical lossless compression algorithms identify and reduce statistical redundancy in order to encode without information loss. Known lossless data compression algorithms include but are not limited to RLE (run-length encoding), Huffman coding, PPM (prediction by partial matching), and LZxx (various Lempel-Ziv techniques). A data set is typically processed serially in order to perform compression. For example, some compression algorithms recognize recurring patterns in a sequence by using a sliding window to compare a pattern currently in the window with previously found patterns. Such reliance on prior knowledge, i.e. the previously found patterns, tends to hinder implementation of parallelized compression of a data sequence. For example, instances of a lossless data compression algorithm running on parallel processor cores cannot independently process different portions of a sequence in order to compress the entire sequence as a single compressed data set. The sequence can be separated into multiple sub-sequences that are each independently compressed, but the overall compression ratio of the sequence may decrease relative to serial processing.

SUMMARY

All examples, aspects and features mentioned in this document can be combined in any technically possible way.

In accordance with an aspect, an apparatus comprises: physical storage comprising a plurality of persistent storage devices; and at least one computing node comprising at least one processor and memory, the processor running a compression algorithm that compresses a new block by: generating a probabilistically unique value that is used as a new block label; performing a probabilistic comparison of the new block label with a plurality of training labels, each training label being uniquely associated with a different training block, thereby identifiying a plurality of training labels that are potentially similar to the new block label; calculating a Hamming distance between each potentially similar training label and the new block label; selecting the training label associated with the smallest calculated Hamming distance; generating a bitmap of differences between the new block and the training block associated with the selected training label; storing the bitmap as a compressed representation of the new block; and discarding the new block. Some implementations comprise a hash function that generates the probabilistically unique value that is used as the new block label. Some implementations comprise a Bloom filter that performs the probabilistic comparison of the new block label with the plurality of training labels. Some implementations comprise an XOR function that generates the bitmap of differences between the new block and the training block associated with the selected training label. In some implementations the compression algorithm compresses the XOR bitmap with Run Length Limited encoding. In some implementations the compressed XOR bitmap is stored in the physical storage. In some implementations a copy of the selected training label is associated with the compressed XOR bitmap and stored in the physical storage. In some implementations the training labels are part of a pre-trained discrimination network. In some implementations the discrimination network is retrained based on data stored in the physical storage. In some implementations the new block is recovered by using the stored training label to locate the training block, decompressing the XOR bitmap, and XORing the training block with the XOR bitmap.

In accordance with an aspect a method comprises: in a storage system comprising physical storage and at least one computing node comprising at least one processor and memory, compressing a new block by: generating a probabilistically unique value that is used as a new block label; performing a probabilistic comparison of the new block label with a plurality of training labels, each training label being uniquely associated with a different training block, thereby identifiying a plurality of training labels that are potentially similar to the new block label; calculating a Hamming distance between each potentially similar training label and the new block label; selecting the training label associated with the smallest calculated Hamming distance; generating a bitmap of differences between the new block and the training block associated with the selected training label; storing the bitmap as a compressed representation of the new block; and discarding the new block. Some implementations comprise hashing the new block to generate the probabilistically unique value that is used as the new block label. Some implementations comprise using a Bloom filter to perform the probabilistic comparison of the new block label with the plurality of training labels. Some implementations comprise using an XOR function to generate the bitmap of differences between the new block and the training block associated with the selected training label. Some implementations comprise compressing the XOR bitmap with Run Length Limited encoding. Some implementations comprise storing the compressed XOR bitmap in the physical storage. Some implementations comprise associating a copy of the selected training label with the compressed XOR bitmap in the physical storage. Some implementations comprise pre-training the discrimination network. Some implementations comprise retraining the discrimination network based on data stored in the physical storage. Some implementations comprise recovering the new block by using the stored training label to locate the training block, decompressing the XOR bitmap, and XORing the training block with the XOR bitmap.

Other aspects, features and implementations may become apparent in view of the detailed description and figures.

DETAILED DESCRIPTION

Figure 1:
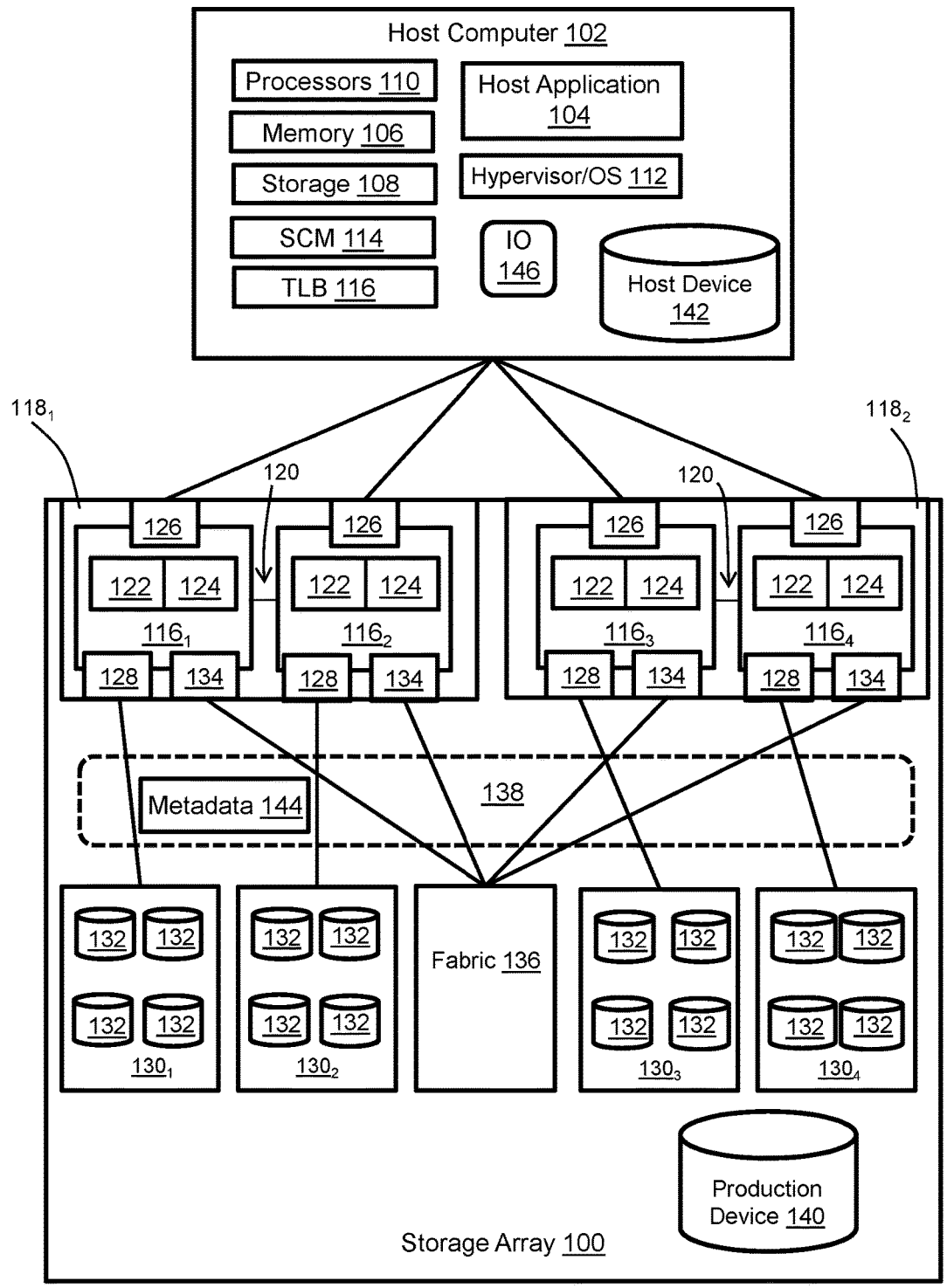
FIG. 1 illustrates a storage array and an associated host in data compression based Hamming distance and difference calculation.

Aspects of the inventive concepts will be described as being implemented in a data storage system that includes a host server and storage array. Such implementations should not be viewed as limiting. Those of ordinary skill in the art will recognize that there are a wide variety of implementations of the inventive concepts in view of the teachings of the present disclosure.

Some aspects, features and implementations described herein may include machines such as computers, electronic components, optical components, and processes such as computer-implemented procedures and steps. It will be apparent to those of ordinary skill in the art that the computer-implemented procedures and steps may be stored as computer-executable instructions on a non-transitory computer-readable medium. Furthermore, it will be understood by those of ordinary skill in the art that the computer-executable instructions may be executed on a variety of tangible processor devices, i.e. physical hardware. For ease of exposition, not every step, device or component that may be part of a computer or data storage system is described herein. Those of ordinary skill in the art will recognize such steps, devices and components in view of the teachings of the present disclosure and the knowledge generally available to those of ordinary skill in the art. The corresponding machines and processes are therefore enabled and within the scope of the disclosure.

The terminology used in this disclosure is intended to be interpreted broadly within the limits of subject matter eligibility. The terms "logical" and "virtual" are used to refer to features that are abstractions of other features, e.g. and without limitation abstractions of tangible features. The term "physical" is used to refer to tangible features, including but not limited to electronic hardware. For example, multiple virtual computing devices could operate simultaneously on one physical computing device. The term "logic" is used to refer to special purpose physical circuit elements, firmware, software, computer instructions that are stored on a non-transitory computer-readable medium and implemented by multi-purpose tangible processors, and any combinations thereof.

As will be explained in greater detail below, data compression may be implemented by recognizing a level of non-identical similarity between a first data set and a second data set, and then using a representation of the differences between the first and second data sets to represent the first data set. In some implementations, for example and without limitation, a first new data set is organized as binary strings of equal length that are compared with a second existing data set that is organized as binary strings of the same length as the first data set. A hash function may be used to generate probabilistically unique values that represent the strings. The values may be used as indicators of the differences between strings. If the Hamming distance between a first string of the first data set and a second string of the second data set is sufficiently small, e.g. and without limitation less than or equal to a predetermined value, then a record (e.g., bitmap) of the differences between the two non-identical but similar strings is generated. The record of the differences may be used as a representation of the first string because the record can be used to recover the first string from the second string. For example, an XOR function may be used to generate the bitmap of the differences between the strings. The XOR function is reversible so the first string can be recovered by XORing the record of the differences with the second string. Compression is achieved because at least some of the strings of the first data set need not be stored in their entirety. Such compression based on Hamming distance and difference calculation may be more suitable for parallelization than typical lossless compression algorithms because it is not reliant on serial processing.

FIG. 1 illustrates a network environment in which compression based on Hamming distance and difference calculation may be implemented. The illustrated environment includes a storage array 100 and an associated host computer 102, of which there may be many. The storage array 100 maintains data for a host application 104, of which there may be more than one instance and type. The host computer 102 may be a generic server or a specialized computer or subsystem with volatile memory 106, persistent storage 108, one or more tangible processors 110, and a hypervisor or OS (operating system) 112. The volatile memory may include RAM (Random Access Memory) of any type. The persistent storage 108 may include tangible persistent storage components of one or more technology types, for example and without limitation SSDs such as flash, and HDDs such as SATA (Serial Advanced Technology Attachment) and FC (Fibre Channel). The host computer may also include SCM (Storage Class Memory) 114. SCM is an emerging storage technology that provides non-volatile storage with IO performance, e.g. latency, approaching that of low performance RAM. The host computer 102 might support multiple virtual hosts running on virtual machines or containers. Although an external host computer is illustrated, internal hosts may be instantiated within the storage array.

The architecture and components of the storage array 100 may include "vanilla" storage servers or specially designed computers, subsystems and other hardware for providing data storage services. In the illustrated example the storage array 100 includes a plurality of computing nodes $116_1$-$116_4$ such as storage directors, for example and without limitation. Pairs of the computing nodes, e.g. ($116_1$, $116_2$) and ($116_3$, $116_4$), may be organized as storage engines $118_1$, $118_2$, respectively, for purposes of failover between computing nodes. The paired computing nodes of each storage engine may be directly interconnected by communication links 120. Each computing node includes at least one tangible multi-core processor 122 and a local volatile memory 124. Each multi-core processor 122 may include CPUs (central processing units), GPUs (graphics processing units), and combinations thereof. The local volatile memory 124 may include, for example and without limitation, components such as RAM of any type. Each computing node may also include one or more FEs 126 (front-end adapters) for communicating with the host computer 102. Each computing node $116_1$-$116_4$ may also include one or more BEs 128 (back end adapters) for communicating with respective associated drive arrays $130_1$-$130_4$, thereby enabling access to managed drives 132. The managed drives 132 may include tangible persistent storage components of one or more technology types, for example and without limitation SCM, SSDs such as flash, and HDDs such as SATA and FC. Each computing node may also include one or more CAs (channel adapters) 134 for communicating with other computing nodes via an interconnecting fabric 136. Each computing node may allocate a portion or partition of its respective local volatile memory 124 to a virtual shared "global" memory 138 that can be accessed by other computing nodes, e.g. via DMA (direct memory access) or RDMA (remote direct memory access).

The storage array 100 maintains data for the host application 104 running on the host computer 102. For example, host application 104 may write host application data to the storage array and read host application data from the storage array in order to perform various functions. Examples of host applications may include but are not limited to file servers, email servers, block servers and databases. A production device 140 and a corresponding host device 142 may be created as logical volumes of storage to enable the storage array to provide storage services to the host application 104. Without limitation, the production device 140 may be referred to as a production device, production volume, production LUN or host LUN, where LUN (Logical Unit Number) is a number used to identify the logical storage volume in accordance with the SCSI (Small Computer System Interface) protocol. The host device 142 is a local representation of the production device 140. Multiple host devices associated with different host computers may be local representations of the same production device. The host device and the production device are abstraction layers between the managed drives 132 and the host application 104. From the perspective of the host application, the host device 142 is a single data storage device having a set of contiguous fixed-size LBAs (logical block addresses) on which data used by the host application resides. However, the data used by the host application may actually be maintained by the computing nodes $116_1$-$116_4$ at non-contiguous addresses on various different managed drives 132.

In order to service IOs from the host application 104 the storage array 100 maintains metadata 144 that indicates, among various things, mappings between production device 140 storage space and the locations of extents of host application data in global memory 138 and on the managed drives 132. In response to an IO 146 from the host application 104 to host device 142, the hypervisor/OS 112 determines whether the IO can be serviced by accessing the host computer memory 106. If that is not possible then the IO is serviced by to the storage array 100. There are multiple paths between the host computer 102 and the storage array 100, e.g. one path per FE 126. The paths may be selected based on a wide variety of techniques and algorithms including, for context and without limitation, performance and load balancing. In the case of a read IO the storage array uses the metadata 144 to find the requested data in the shared global memory 138 or managed drives 132. More particularly, if the requested data is not in the shared global memory 138 then the requested data is temporarily copied into the shared global memory from the managed drives 132. The copy of the requested data in the shared global memory is used to satisfy the TO, i.e. reply to the host application via one of the computing nodes. In the case of a write IO the storage array copies the data into shared global memory, marks the data as dirty, and creates new metadata that maps the production device address with a location to which the data is written on the managed drives. The shared global memory may enable the production device to be reachable via all of the computing nodes and paths, although the storage array can be configured to limit use of certain paths to certain production devices.

Figure 2:
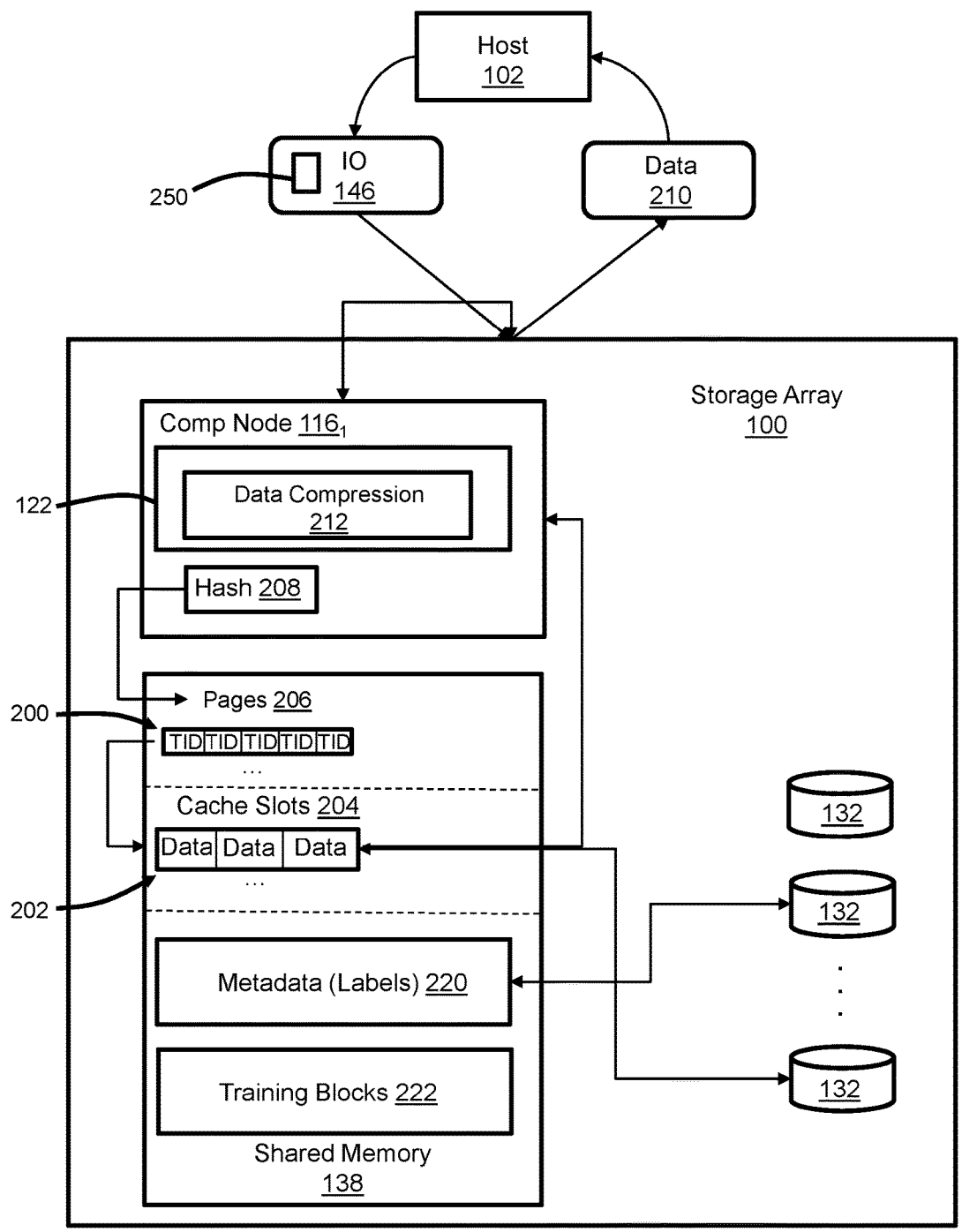
FIG. 2 illustrates aspects of the computing nodes and shared memory of FIG. 1 in greater detail.

Referring to FIG. 2, the cached metadata 144 (FIG. 1) may include TIDs (track ID tables) 200 that are stored in an allocated portion of the shared global memory 138. The TIDs 200 contain pointers to host application data 202 located in cache slots 204 in another portion of the shared global memory 138 that is allocated for data. The TIDs may be maintained in fixed-size pages 206, e.g. and without limitation 4 KB, where each page holds multiple TIDs. In order to satisfy IO 146 received from the host computer 102 the receiving computing node, e.g. computing node $116_1$, may identify corresponding TIDs by inputting the device number, cylinder number, head (track) and size obtained from the IO 146 into a hash table 208. A wide variety of descriptive data structures could be used, of which hash table 208 is simply one example. The hash table 208 indicates the locations of TIDs in pages 206 in the shared global memory 138 by outputting a corresponding page number. The page number is used to locate the page that holds the TIDs in the shared global memory. The TIDs are obtained from the shared global memory and used to find and retrieve the corresponding data from the cache slots 204 or managed drives 132. In the case of a Read IO the data 210 may then be returned to the host computer 102. In the case of a write IO a data compression algorithm 212 running on the multi-core processor 122 of computing node $116_1$ performs compression based on Hamming distance and difference calculation.

Figure 3:
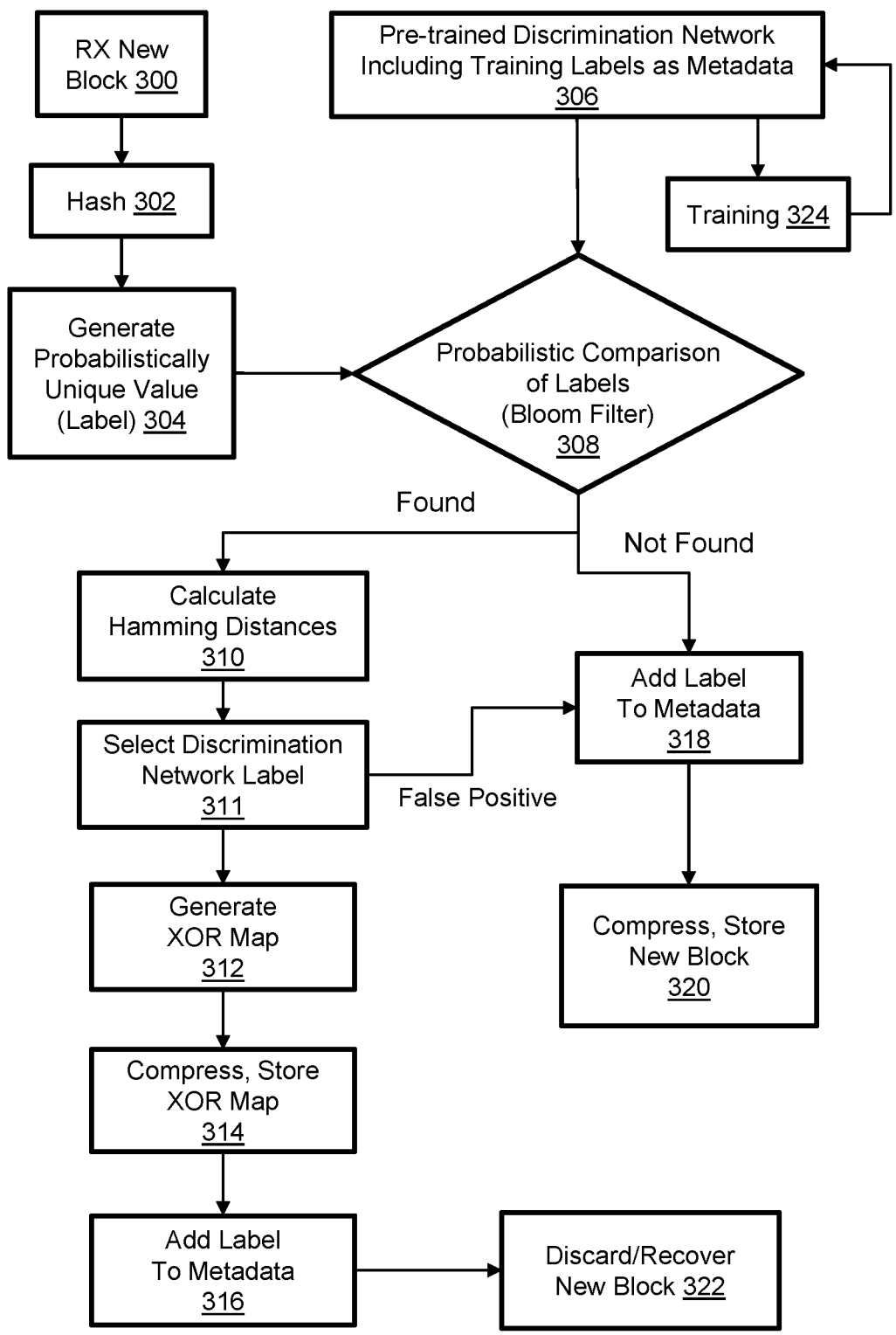
FIG. 3 illustrates operation of the compression algorithm of FIG. 2.

Operation of the compression algorithm will be described with reference to FIGS. 2 and 3. The compression algorithm 212 receives a new block 250 of data from IO 146 as indicated in step 300. The new block of data may be processed as a single string or organized into multiple strings of equal predetermined length. For purposes of explanation the new block is processed as a single string that is provided to a hash function 302 that generates a probabilistically unique value based on the new block data as indicated in step 304. The probabilistically unique value is used as a label to represent the new block 250 from which it was generated, i.e. as a new block label. A pre-trained discrimination network 306 includes a plurality of training labels that are stored as metadata 220 in the shared global memory 138. Each training label in the pre-trained discrimination network is uniquely associated with a different block of training data. The training blocks 222 may be stored in the managed drives 132 and individually copied into shared memory 138 as needed. As indicated in step 308, a probabilistic comparison is performed to identify training labels in the pre-trained discrimination network 306 that are potentially similar to the new block label. For example and without limitation, a Bloom filter may be used to provide the probabilistic comparison. The output of step 308 includes one or more probabilistically similar training labels, if any are found, or an indication that probabilistically similar training labels were not found. As indicated in step 310, if probabilistically similar training labels were found in step 308 then the Hamming distance between each of the probabilistically similar training labels and the corresponding new block label is calculated. The resulting Hamming distances are used as predictors of similarity between the corresponding blocks of data, i.e. the new block and the training blocks. The most similar training label, i.e. the discrimination network label with the lowest Hamming distance relative to the new block label, is selected as indicated in step 311. As indicated in step 312, an XOR bitmap is generated by XORing the new block binary data with the binary data of the training block associated with the selected training label. The XOR bitmap encodes only those bits that differ between the two blocks, and thus represents the actual differences between the two blocks of data, i.e. the non-matching bits. The XOR bitmap is compressed and stored as indicated in step 314. For example and without limitation, RLL (Run Length Limited) encoding can be used to compress the XOR bitmap. With short Hamming distances, the XOR bitmaps will typically have many fewer 1 bits (indicating those bits that differ) than 0 bits (indicating those bits that do not differ). Consequently, RLL encoding can be used to efficiently compress the XOR bitmaps, e.g. and without limitation by orders of magnitude. Furthermore, only one of the two blocks needs to be stored in its entirety. For example, the new block may be discarded as indicated in step 322 because it is represented by the XOR bitmap and the selected training block. The compressed XOR bitmap may be stored in the managed drives along with copies of the new block label and the selected training label. Provided that the RLL encoded bitmap is smaller than the new block by greater than 24 bytes (needed for storing the labels), then compression has been achieved. In the illustrated example the new block label is added to the metadata 220 as indicated in step 316.

If the output of step 308 is an indication that probabilistically similar training labels were not found then the new block label is added to the metadata as indicated in step 318. Flow may also proceed to step 318 if the most similar training label fails to satisfy a Hamming distance threshold in step 311, in which case a false positive is declared. In either case the new block is compressed and stored in the managed drives as indicated in step 320.

The stored labels and bitmap allow the original new block to be recovered when needed as indicated in step 322. The stored compressed XOR bitmap and training block are copied into shared memory, the XOR bitmap is decompressed, and the XOR function is used in reverse to recover the original new block from the training block by XORing the bitmap with the training block. Although training blocks may be stored on the managed drives, a training block that has many similar new blocks may be maintained in shared global memory in order to avoid latency associated with reading the training block from the managed drives.

The discrimination network may be pre-trained in step 324 to discriminate input data into some N number of categories (e.g. N=64), with some form of k-NearestNeighbor value along each of the N dimensions. The training set may include 16 KB blocks of random bytes that are labeled with random 64-bit labels that are unique to each block. Although 16 KB blocks are described herein, a wide variety of sizes might be implemented. For example, a larger size would reduce the amount of metadata to be maintained. Starting with a first set of base blocks and labels, a second set of blocks that differ from the first set of base blocks is generated for each of those base blocks and its associated label. The first block of the second set of blocks differs from the associated base block by 1 bit that is selected at random. The block label is differentiated by flipping the bit that corresponds to the 256-byte region in the base label where the random bit was changed. The next new block differs by 2 bits from the associated base block, again selected at random, and the associated label has two bits flipped in the same manner described above. Each bit is tested to determine whether it falls within the same 256-byte region, and the bit flip is not done if the region is already different from the associated base block in that position. The process continues until the final block in the set differs from the original in 8K bit positions, and the label for that may differ by up to 64 bits.

During training 324 the labels may be represented by 64 floating point numbers rather than by integer 1 or 0 bits. The floating point numbers are always in the range (0.0, 1.0] and represent the probability that the floating point number is a 1 in the final bit position. Thus, these numbers represent the probability that any given block will be located in a 64-dimensional unit coordinates is a measure of the similarity of those blocks to each other. Blocks with closer RMS values will be more similar than those with larger RMS values. By assigning a rectified linear unit function to each floating point coordinate, a 64-bit hash can be derived such that the Hamming distance is a reasonable approximation to the RMS coordinate distance. Once the network had been trained on such data, it will predict a 64-bit label that is categorized as being similar to any other block with the similarity being given by the Hamming distance between their respective labels. Retraining may be performed as needed and as resources become available.

The base network weights may be retrained using actual system data. This won't affect the data previously stored, but it will change the distribution of categories (the Voronoi boundaries) of the discriminator to prevent hash collisions for large amounts of very similar data. If this is not done, then it may be possible for certain blocks to be used as the base data for too many other blocks in the system.

If any block that is used as base data is modified, any dependent XOR bitmaps might also need to be modified. There are several ways of dealing with this, including determining whether the modification is itself XOR bitmap efficient, or if not, then flagging the metadata such that dependent blocks use a snap copy of the original rather than the newly modified version. Since the dependent blocks were all sufficiently close, a fully restored copy of any of those can then be used as the base data for the remaining dependents and the original snap copy can be safely retired.

Because the data compression algorithm 212 is not limited to serial processing of inputted data, compression is parallelized in some implementations. For example and without limitation, different GPU cores may independently process portions of a data set in order to generate a single compressed data set.

Specific examples have been presented in order to provide context and convey inventive concepts. The specific examples are not to be considered as limiting. A wide variety of modifications may be made without departing from the scope of the inventive concepts described herein. Moreover, the features, aspects, and implementations described herein may be combined in any technically possible way. Accordingly, modifications and combinations are within the scope of the following claims.

What is claimed is:
1. An apparatus comprising:
physical storage comprising a plurality of persistent storage devices; and
at least one computing node comprising at least one processor and memory, the processor running a compression algorithm that compresses a new block by:
generating a probabilistically unique value that is used as a new block label;
performing a probabilistic comparison of the new block label with a plurality of training labels, each training label being uniquely associated with a different train- ing block, thereby identifiying a plurality of training labels that are potentially similar to the new block label;

calculating a Hamming distance between each potentially similar training label and the new block label;

selecting the training label associated with the smallest calculated Hamming distance;

generating a bitmap of differences between the new block and the training block associated with the selected training label;

storing the bitmap as a compressed representation of the new block; and discarding the new block.

2. The apparatus of claim 1 comprising a hash function that generates the probabilistically unique value that is used as the new block label.

3. The apparatus of claim 1 comprising a Bloom filter that performs the probabilistic comparison of the new block label with the plurality of training labels.

4. The apparatus of claim 1 comprising an XOR function that generates the bitmap of differences between the new block and the training block associated with the selected training label.

5. The apparatus of claim 4 wherein the compression algorithm compresses the XOR bitmap with Run Length Limited encoding.

6. The apparatus of claim 5 wherein the compressed XOR bitmap is stored in the physical storage.

7. The apparatus of claim 6 wherein a copy of the selected training label is associated with the compressed XOR bitmap and stored in the physical storage.

8. The apparatus of claim 1 wherein the training labels are part of a pre-trained discrimination network.

9. The apparatus of claim 8 wherein the discrimination network is retrained based on data stored in the physical storage.

10. The apparatus of claim 7 wherein the new block is recovered by using the stored training label to locate the training block, decompressing the XOR bitmap, and XOR-ing the training block with the XOR bitmap.

11. A method comprising:
in a storage system comprising physical storage and at least one computing node comprising at least one processor and memory, compressing a new block by:
generating a probabilistically unique value that is used as a new block label;
performing a probabilistic comparison of the new block label with a plurality of training labels, each training label being uniquely associated with a different training block, thereby identifiying a plurality of training labels that are potentially similar to the new block label;
calculating a Hamming distance between each potentially similar training label and the new block label;
selecting the training label associated with the smallest calculated Hamming distance;
generating a bitmap of differences between the new block and the training block associated with the selected training label;
storing the bitmap as a compressed representation of the new block; and
discarding the new block.

12. The method of claim 11 comprising hashing the new block to generate the probabilistically unique value that is used as the new block label.

13. The method of claim 11 using a Bloom filter to perform the probabilistic comparison of the new block label with the plurality of training labels.

14. The method of claim 11 comprising using an XOR function to generate the bitmap of differences between the new block and the training block associated with the selected training label.

15. The method of claim 14 comprising compressing the XOR bitmap with Run Length Limited encoding.

16. The method of claim 15 comprising storing the compressed XOR bitmap in the physical storage.

17. The method of claim 16 comprising associating a copy of the selected training label with the compressed XOR bitmap in the physical storage.

18. The method of claim 11 comprising pre-training the discrimination network.

19. The method of claim 18 comprising retraining the discrimination network based on data stored in the physical storage.

20. The method of claim 17 comprising recovering the new block by using the stored training label to locate the training block, decompressing the XOR bitmap, and XOR-ing the training block with the XOR bitmap.

* * * * *